(12) United States Patent
Kim et al.

(10) Patent No.: US 9,437,789 B2
(45) Date of Patent: Sep. 6, 2016

(54) LIGHT GENERATING DEVICE AND METHOD OF MANUFACTURING THE SAME

(71) Applicant: Intellectual Discovery Co., Ltd., Seoul (KR)

(72) Inventors: Tae-Geun Kim, Seongnam-si (KR); Sang-Young Park, Seoul (KR)

(73) Assignee: INTELLECTUAL DISCOVERY CO., LTD., Seoul (KR)

( * ) Notice: Subject to any disclaimer, the term of this patent is extended or adjusted under 35 U.S.C. 154(b) by 0 days.

(21) Appl. No.: 14/224,972

(22) Filed: Mar. 25, 2014

(65) Prior Publication Data

US 2014/0284646 A1   Sep. 25, 2014

(30) Foreign Application Priority Data

Mar. 25, 2013 (KR) .................. 10-2013-0031241

(51) Int. Cl.
| | | |
|---|---|---|
| *H01L 33/60* | (2010.01) | |
| *H01L 33/38* | (2010.01) | |
| *H01L 33/22* | (2010.01) | |
| *H01L 33/40* | (2010.01) | |

(52) U.S. Cl.
CPC ............. *H01L 33/60* (2013.01); *H01L 33/382* (2013.01); *H01L 33/22* (2013.01); *H01L 33/405* (2013.01)

(58) Field of Classification Search
None
See application file for complete search history.

(56) References Cited

U.S. PATENT DOCUMENTS

| | | | |
|---|---|---|---|
| 2011/0049472 A1 | 3/2011 | Kim et al. | |
| 2011/0220932 A1* | 9/2011 | Katsuno et al. | ................ 257/98 |
| 2012/0007118 A1* | 1/2012 | Choi et al. | ...................... 257/98 |

FOREIGN PATENT DOCUMENTS

| | | |
|---|---|---|
| CN | 102456785 A | 5/2012 |
| JP | 2000-077708 A | 3/2000 |
| KR | 100809216 B1 | 2/2008 |

* cited by examiner

*Primary Examiner* — Yasser A Abdelaziez

(57) ABSTRACT

A light generating device and a method of manufacturing the light generating device are disclosed. The light generating device includes a p-type semiconductor layer, an n-type semiconductor layer, an active layer, a p-type electrode and an n-type electrode. The active layer is disposed between the p-type semiconductor layer and the n-type semiconductor layer. The p-type electrode provides the p-type semiconductor layer with holes. The n-type electrode provides the n-type semiconductor layer with electrons. At least one of the p-type electrode and n-type electrode has a protrusion protruding toward p-type semiconductor layer and the n-type semiconductor layer, respectively. Therefore, light efficiency is enhanced.

6 Claims, 3 Drawing Sheets

LIGHT GENERATING DEVICE AND METHOD OF MANUFACTURING THE SAME

CROSS REFERENCE TO RELATED APPLICATION

This application claims priority from and the benefit of Korean Patent Application No. 10-2013-0031241 filed on Mar. 25, 2013, which is hereby incorporated by reference for all purposes as if fully set forth herein.

BACKGROUND OF THE INVENTION

1. Field of the Invention

The present invention relates to a light generating device and a method of manufacturing the light generating device, more specifically to a light generating device with semiconductor and a method of manufacturing the light generating device.

2. Discussion of the Background

In general, a light generating device such as a light emitting diode (LED) has merits such as high efficiency, long lifetime, a low power consumption, eco friendliness, etc., so that the light generating device is employed in various fields.

The light generating device may be divided into two types of a lateral type and a vertical type according to a shape. According to the lateral type light generating device, an n-type semiconductor layer is formed on a substrate, and a quantum well layer (or active layer) and a p-type semiconductor layer are formed in sequence. Then, a portion of the p-type semiconductor layer and the quantum well layer is removed to expose the n-type semiconductor layer, and a p-type electrode is formed on the p-type semiconductor layer and an n-type electrode is formed on an exposed region of the n-type semiconductor layer.

The vertical type LED (or VLED) has merits such as effective heat dissipation, high electro optical characteristics to appeal, but still it is essential to enhance to light extracting efficiency for high efficiency VLED for a lighting apparatus.

The external quantum efficiency of LED is determined by multiplying internal quantum efficiency with light extracting efficiency, and the internal quantum efficiency is determined by current injection efficiency. Therefore, in order to enhance efficiency of LED, effective current distribution from an electrode to a semiconductor layer and effective injection of carrier to a quantum well layer are required.

Further, when light generated from the quantum well layer is emitted outside, a portion of the light is totally reflected due to a difference of refractive index between air and semiconductor material to lower efficiency. In order to solve the problem, roughness may be formed on a top surface of LED, or transparent and conductive material such as ITO is applied to an n-type electrode to enhance efficiency.

However, thermal damage may be generated in a high temperature process of n-type electrode of LED so that there is limitation if electrode research for high efficiency. The above problems induce low efficiency of LED. Therefore, still many researches are performed to enhance efficiency of LED.

A conventional VLED will be described in detail referring to FIG. 1.

FIG. 1 is a cross-sectional view showing a conventional VLED.

Referring to FIG. 1, a conventional vertical type LED (VLED) includes a substrate 110, a p-type electrode 120, a p-type semiconductor layer 130, an active layer 140, an n-type semiconductor layer 140 and an n-type electrode 160 in sequence. Light L generated in the active layer 140 and advance vertically upward is reflected by the n-type electrode 160 to advance downward. The light advancing downward is reflected by the substrate 110 to advance upward, so that the light L advanced upward and downward repeatedly to be attenuated. Therefore, the n-type electrode 160 makes a light loss by the about of area of the n-type electrode 160 in the total area of the VLED. Additionally, the p-type electrode 120 has substantially the same as the active layer 140 in area, and holes are uniformly provided from the p-type electrode 120 to the active layer 140 but the current I (in detail, electrons) cannot be uniformly provided to the active layer 140 from the n-type electrode 160. Therefore, only a portion of the active layer 140 generates light to reduce efficiency.

SUMMARY OF THE INVENTION

Therefore, the present invention provides a light generating device capable of enhancing light extracting efficiency and distributing electrons to improve efficiency.

The present invention also provides a method of manufacturing the light generating device.

The light generating device includes a p-type semiconductor layer, an n-type semiconductor layer, an active layer, a p-type electrode and an n-type electrode. The active layer is disposed between the p-type semiconductor layer and the n-type semiconductor layer. The p-type electrode provides the p-type semiconductor layer with holes. The n-type electrode provides the n-type semiconductor layer with electrons. At least one of the p-type electrode and n-type electrode has a protrusion protruding toward p-type semiconductor layer and the n-type semiconductor layer, respectively.

For example, the protrusion may have V-shape or U-shape.

For example, the light generating device may further include a light reflecting layer covering the protrusion.

For example, the light generating device may further include an ohmic contact layer covering the light reflecting layer.

For example, the p-type electrode or the n-type electrode may include at least one of nickel (Ni) and gold (Au), the light reflecting layer may include at least one of aluminum (Al) and silver (Ag), and the ohmic contact layer may include at least one of titanium (Ti) and chromium (Cr).

For example, the light generating device may further include an insulating layer covering the light reflecting layer.

For example, the p-type electrode or the n-type electrode may include at least one of nickel (Ni) and gold (Au), the light reflecting layer may include at least one of aluminum (Al) and silver (Ag), and the insulating layer may include silicon oxide ($SiO_2$) or silicon nitride (SiN).

The method of manufacturing a light generating device, includes preparing a semiconductor structure with a p-type semiconductor layer, an n-type semiconductor layer, and an active layer disposed between the p-type semiconductor layer and the n-type semiconductor layer, removing a portion of at least one of the p-type semiconductor layer and the n-type semiconductor layer to form a V-shaped groove or a U-shaped groove, and forming at least one of an n-type electrode and a p-type electrode filling up the V-shaped groove or the U-shaped groove of the n-type semiconductor layer and the p-type semiconductor layer, respectively.

For example, the method may further include forming a light reflecting layer on an inner surface of the V-shaped groove or the U-shaped groove, before forming at least one of an n-type electrode and a p-type electrode filling up the V-shaped groove or the U-shaped groove.

For example, the method may further include forming an ohmic contact layer on the inner surface of the V-shaped groove or the U-shaped groove, before forming the light reflecting layer.

For example, the method may further include forming an insulating layer on the inner surface of the V-shaped groove or the U-shaped groove, before forming the light reflecting layer.

According to the present invention, electrodes have protrusion so that light arriving at the lower surface is reflected toward side, so that light efficiency is improved.

Additionally, currents applied to the active layer are widely distributed so that light is generated relatively large area to improve light efficiency.

Further, a contact area between the electrodes and the semiconductor layer increases to increase current flow so that active voltage of the light generating device can be lowered.

When the light reflecting layer is formed, the light efficiency is more improved.

Further, when the ohmic contact layer is formed under the light reflecting layer, electric characteristics between the semiconductor and the metal is improved.

Furthermore, when the insulating layer is formed under the light reflecting layer, current can be more widely distributed to enhance light efficiency.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

Figure 1:
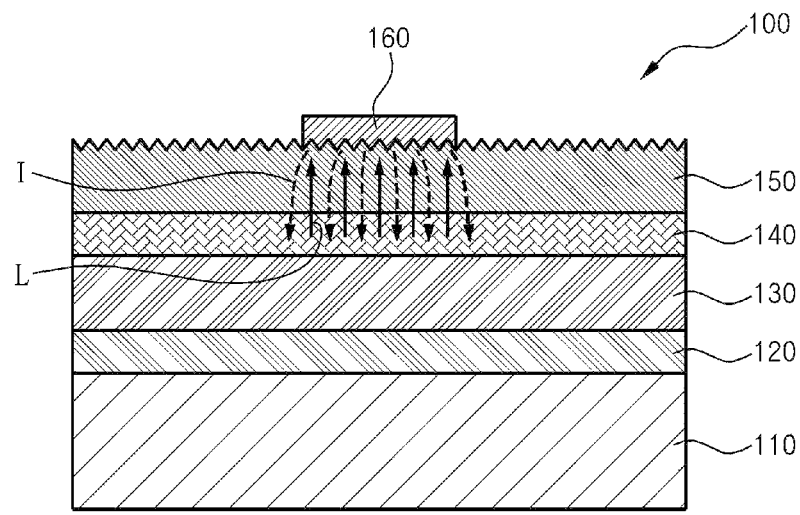
FIG. 1 is a cross-sectional view showing a conventional VLED.

DETAILED DESCRIPTION OF THE
ILLUSTRATED EMBODIMENTS

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

Hereinafter, exemplary embodiments of the present invention will be described in detail with reference to the accompanying drawings.

Figure 2:
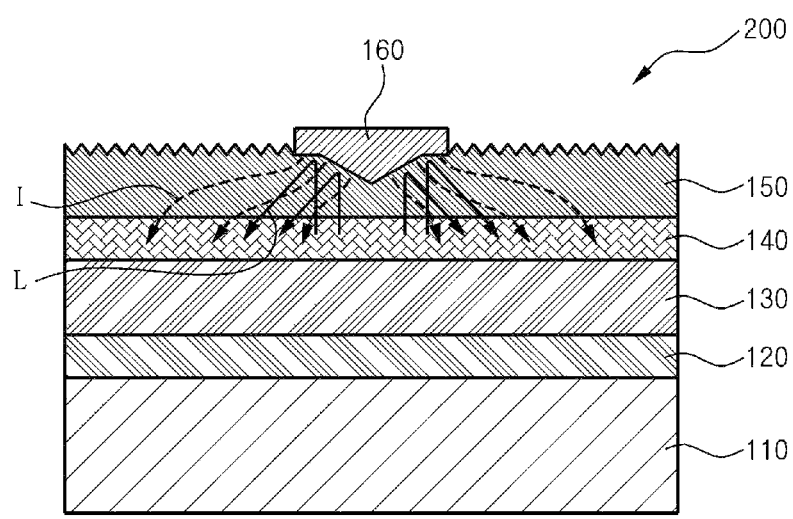
FIG. 2 is a cross-sectional view showing a vertical type light generating device according to an exemplary embodiment of the present invention.

FIG. 2 is a cross-sectional view showing a vertical type light generating device according to an exemplary embodiment of the present invention.

Referring to FIG. 2, a light generating device 200 according to an exemplary embodiment of the present invention includes a p-type semiconductor layer 130, an active layer 140, an n-type semiconductor layer 150, a p-type electrode 120 and an n-type electrode 160.

The active layer 140 is disposed between the p-type semiconductor layer 130 and the n-type semiconductor layer 150. At least one of the p-type electrode 120 and n-type electrode 160 has a protrusion protruding toward p-type semiconductor layer 130 and the n-type semiconductor layer 150, respectively. When the light generating device is the vertical type as shown in FIG. 2, the protrusion may be formed only at the n-type electrode 160. However, when the light generating device is lateral type, the protrusion may be formed at least one of the p-type electrode 120 and n-type electrode 160.

The p-type electrode 120 may be formed on a substrate 110. For example, a metal substrate may be used as the substrate 110. For example, the p-type electrode 120 may include metal. When the p-type electrode 120 includes metal, light generated by the active layer 140 and advancing downward is reflected by the p-type electrode 120. The p-type electrode 120 provides the p-type semiconductor layer with holes.

The p-type semiconductor layer 130 is formed on the p-type electrode 120. For example, the p-type semiconductor layer 130 may include a gallium nitride semiconductor with p-type dopants.

The active layer 140 is formed on the p-type semiconductor layer 130. For example, the active layer 140 may include gallium nitride semiconductor.

The active layer 140 may have a multi quantum well structure, and holes provided by the p-type semiconductor layer 130 and electrodes provided by n-type semiconductor layer 150 meets each other in the active layer 140 to generate light.

Figure 6:
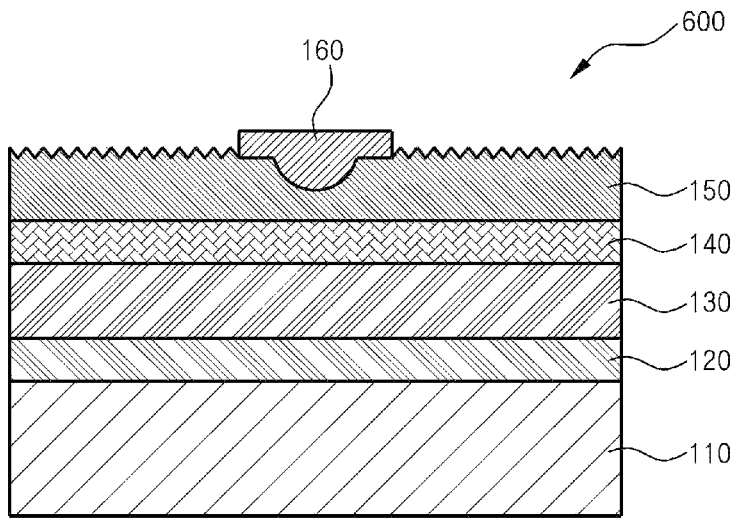
FIG. 6 is a cross-sectional view showing a vertical type light generating device according to still another exemplary embodiment of the present invention.

The n-type semiconductor layer 150 is formed on the active layer 140. For example, the n-type semiconductor layer 150 may include a gallium nitride semiconductor with n-type dopants. In this case, the n-type semiconductor layer 150 may have a V-shaped groove as shown in FIG. 2 or a U-shaped groove as shown in FIG. 6

The n-type electrode 160 is formed at a region of the V-shaped groove such that the n-type electrode 160 fills up the V-shaped groove. Therefore, the n-type electrode 160 has a V-shaped protrusion. However, the shape of the V-shaped groove and the V-shaped protrusion of the n-type electrode 160 are not limited but may be variously changed. For example, the groove of the n-type semiconductor layer 150 and the protrusion of the n-type electrode 160 may have a polygonal shape or rounded shape. The n-type electrode 160 provides the n-type semiconductor layer 150 with electrons. For example, the n-type electrode 160 includes at least one of nickel (Ni) and gold (Au). However, the n-type electrode 160 may include other material.

Referring to FIG. 2 showing the light generating device 200 according to an exemplary embodiment of the present invention and FIG. 1 showing a conventional light generating device 100, the light L generated by the active layer 140 and advancing vertically upward is reflected by the n-type electrode 160 to advance vertically downward and is reflected again by the p-type electrode 120 or the substrate 110 to advance vertically upward to become extinct according to the conventional light generating device in FIG. 1.

However, the light L generated by the active layer 140 and advancing vertically upward is reflected toward side and reflected by interfaces of layers to escape upward according to an exemplary embodiment of the present invention in FIG. 2. Therefore, a light efficiency may be improved.

Further, in comparison with the electrons flow I from the n-type electrode 160 to the active layer 140 according to the conventional light generating device 100 in FIG. 1, the electrons flow I is widely distributed from the n-type electrode 160 to the active layer 140 according to an exemplary embodiment of the present invention in FIG. 2. Therefore, relatively large area of active layer 140 generates light to improve light efficiency.

Additionally, the contact area of the n-type electrode 160 and the n-type semiconductor layer 150 increases according to the exemplary embodiment of the present invention in FIG. 2 so that relatively large amount of current may flow to lower active voltage.

Figure 3:
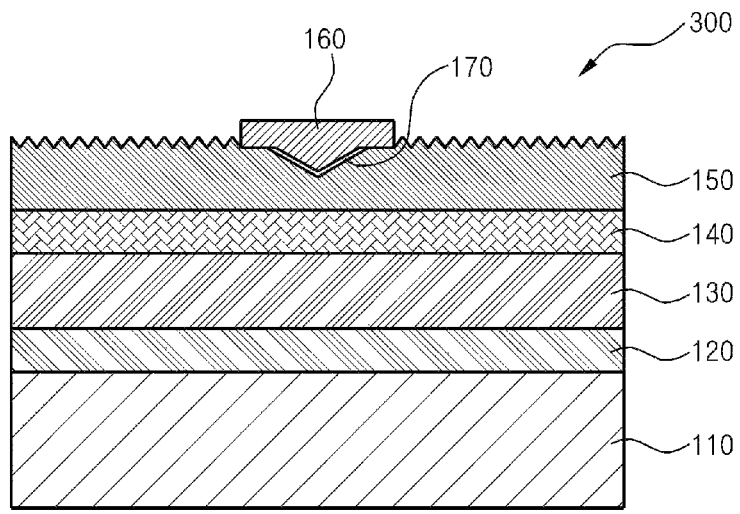
FIG. 3 is a cross-sectional view showing a vertical type light generating device according to another exemplary embodiment of the present invention.

FIG. 3 is a cross-sectional view showing a vertical type light generating device according to another exemplary embodiment of the present invention. The light generating device 300 in FIG. 3 is substantially same as the light generating device 200 in FIG. 2 except for a light reflecting layer 170. Therefore, same reference numerals will be used for same or similar elements and any further explanation will be omitted.

Referring to FIG. 3, the light generating device 300 according to another exemplary embodiment of the present invention includes a p-type semiconductor layer 130, an active layer 140, an n-type semiconductor layer 150, a p-type electrode 120, an n-type electrode 160 and a light reflecting layer 170.

The light reflecting layer 170 covers the U-shaped or V-shaped protrusion. In other words, the light reflecting layer 170 is formed under the n-type electrode 160. In detail, the light reflecting layer 170 is disposed between the protrusion of the n-type electrode 160 and the n-type semiconductor layer 150.

The light reflecting layer 170 improves reflectivity of light generated by the active layer 140 and advancing vertically upward to improve light efficiency of the light generating device 300. For example, the light reflecting layer 170 may include metal with high reflectivity such as aluminum (Al) or silver (Ag).

Figure 4:
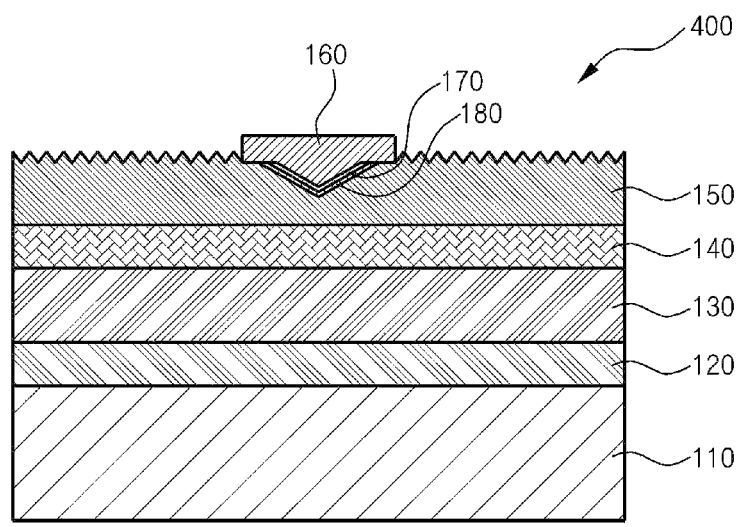
FIG. 4 is a cross-sectional view showing a vertical type light generating device according to still another exemplary embodiment of the present invention.

FIG. 4 is a cross-sectional view showing a vertical type light generating device according to still another exemplary embodiment of the present invention. The light generating device 400 in FIG. 4 is substantially same as the light generating device 300 in FIG. 3 except for an ohmic contact layer 180. Therefore, same reference numerals will be used for same or similar elements and any further explanation will be omitted.

Referring to FIG. 4, the light generating device 400 according to still another exemplary embodiment of the present invention includes a p-type semiconductor layer 130, an active layer 140, an n-type semiconductor layer 150, a p-type electrode 120, an n-type electrode 160, a light reflecting layer 170 and an ohmic contact layer 180.

The ohmic contact layer 180 is formed to cover the light reflecting layer 170. In other words, the ohmic contact layer 180 is formed under the light reflecting layer 170. The ohmic s contact layer 180 may include, for example, a titanium (Ti) and chromium (Cr), and is thin enough so that light can pass through the ohmic contact layer 180.

The ohmic contact layer 180 improves electric characteristics of interface between the n-type semiconductor layer 150 and the light reflecting layer 170 including metal. That is, the ohmic contact layer 180 reduces band gap between the semiconductor layer and the metal layer to improve electric characteristics.

Figure 5:
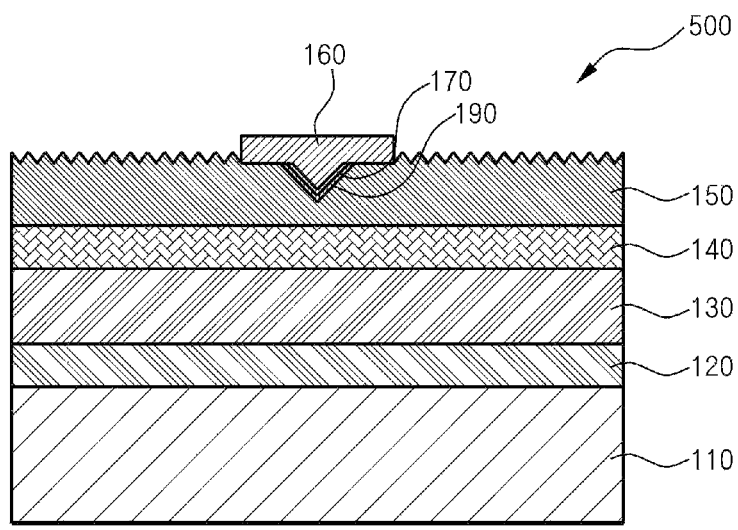
FIG. 5 is a cross-sectional view showing a vertical type light generating device according to still another exemplary embodiment of the present invention.

FIG. 5 is a cross-sectional view showing a vertical type light generating device according to still another exemplary embodiment of the present invention. The light generating device 500 in FIG. 5 is substantially same as the light generating device 300 in FIG. 3 except for an insulating layer 190. Therefore, same reference numerals will be used for same or similar elements and any further explanation will be omitted.

Referring to FIG. 5, the light generating device 400 according to still another exemplary embodiment of the present invention includes a p-type semiconductor layer 130, an active layer 140, an n-type semiconductor layer 150, a p-type electrode 120, an n-type electrode 160, a light reflecting layer 170 and an insulating layer 190.

The insulating layer 190 is formed under the light reflecting layer 170. In detail, the insulating layer 190 is formed such that the insulating layer 190 covers only a protrusion of the n-type electrode 160. Therefore, it is preferable that the protrusion in FIG. 5 is smaller than the protrusion in FIG. 4 in width.

The insulating layer 190 includes, for example, silicon oxide ($SiO_2$) or silicon nitride (SiN).

When the insulating layer 190 is formed, current cannot flow through the protrusion of the n-type electrode 160. However, the current flowing through interface between the n-type semiconductor layer 150 and the n-type electrode 160 relatively increases, and current flowing vertically downward relatively decreases. However, the light generated in a portion of the active layer 140, the portion being directly under the n-type electrode 160, and extracted outside is relatively small in comparison the light generated other portion of the active layer 140, the other portion being sides portion. Therefore, total light efficiency can be improved.

FIG. 6 is a cross-sectional view showing a vertical type light generating device according to still another exemplary embodiment of the present invention. The light generating device 600 in FIG. 6 is substantially same as the light generating device 200 in FIG. 2 except for a shape of the protrusion of n-type electrode. Therefore, same reference numerals will be used for same or similar elements and any further explanation will be omitted.

Referring to FIG. 6, the light generating device 600 according to still another exemplary embodiment of the present invention includes a p-type semiconductor layer 130, an active layer 140, an n-type semiconductor layer 150, a p-type electrode 120 and an n-type electrode 160. The n-type semiconductor layer 150 may have a U-shaped groove as shown in FIG. 6.

The n-type electrode 160 is formed at a region of the U-shaped groove such that the n-type electrode 160 fills up the U-shaped groove. Therefore, the n-type electrode 160 has a U-shaped protrusion.

It is obvious to a person skilled in the art that the embodiments in FIG. 4 and FIG. 5 may also be applied to the U-shaped protrusion. Further the above embodiments can adopt other embodiments.

Further, hereinbefore, the light generating devices of above are explained through a vertical type, but the protrusion of the electrodes can be applied to a lateral type light generating device having a structure described in the discussion of background.

Hereinafter, a method of manufacturing the light generating devices 200, 300, 400, 500 and 600 will be explained.

First, a semiconductor structure with the p-type semiconductor layer 130, the active layer 140 formed on the p-type semiconductor layer 130, and the n-type semiconductor layer 150 formed on the active layer 140 is prepared. The method of forming the semiconductor structure is substantially same as the conventional method. Therefore, any further explanation will be omitted.

Then, a portion of the n-type semiconductor layer 150 is removed to form V-shaped or U-shaped groove. In order to form the V-shaped or U-shaped groove on the n-type semiconductor layer 150, ICP-RIE may be used. By adjusting process condition such as RF power, gas flow rate ($BCl_3$, $Cl_2$, $H_2$, etc.), pressure of chamber, etc., the V-shaped or U-shaped groove can be formed on the n-type semiconductor layer 150.

Then, in order to fill up the V-shaped or U-shaped groove on the n-type semiconductor layer 150, metals such as nickel (Ni) and/or gold (Au) is deposited to form the n-type electrode 160.

On the other hand, before forming the n-type electrode 160 filling up the V-shaped or U-shaped groove, the light reflecting layer 170 may be formed at an inner surface of the V-shaped or U-shaped groove.

Additionally, before forming the light reflecting layer 170, the ohmic contact layer 180 or the insulating layer 190 may be formed at the inner surface of the V-shaped or U-shaped groove.

The light reflecting layer 170, the ohmic contact layer 180, the insulating layer 190 etc. may be formed through sputter or e-beam apparatus.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light generating device comprising:
    a p-type semiconductor layer;
    an n-type semiconductor layer;
    an active layer disposed between the p-type semiconductor layer and the n-type semiconductor layer;
    a p-type electrode providing the p-type semiconductor layer with holes; and
    an n-type electrode providing the n-type semiconductor layer with electrons, wherein at
    least one of the p-type electrode and n-type electrode has a protrusion protruding toward p-type semiconductor layer and the n-type semiconductor layer, respectively, and
    wherein the at least one of the p-type electrode and n-type electrode having a protrusion includes at least one of nickel (Ni) and gold (Au), and the protrusion is directly covered by a light reflecting layer including at least one of aluminum (Al) and silver (Ag).

2. The light generating device of claim 1, wherein the protrusion has V-shape or U-shape.

3. The light generating device of claim 1, further comprising an ohmic contact layer covering the light reflecting layer.

4. The light generating device of claim 3, wherein
    the ohmic contact layer includes at least one of titanium (Ti) and chromium (Cr).

5. The light generating device of claim 1, further comprising an insulating layer covering the light reflecting layer.

6. The light generating device of claim 5, wherein the insulating layer includes silicon oxide (SiO2) or silicon nitride (SiN).

* * * * *